(12) United States Patent
Yamamoto et al.

(10) Patent No.: US 8,587,000 B2
(45) Date of Patent: Nov. 19, 2013

(54) LIGHT-EMITTING ELEMENT, LIGHT-EMITTING DEVICE, DISPLAY, AND ELECTRONIC APPARATUS

(75) Inventors: Hidetoshi Yamamoto, Suwa (JP); Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 599 days.

(21) Appl. No.: 12/718,558

(22) Filed: Mar. 5, 2010

(65) Prior Publication Data
US 2010/0237338 A1    Sep. 23, 2010

(30) Foreign Application Priority Data
Mar. 23, 2009 (JP) .................. 2009-070434

(51) Int. Cl.
*H01L 27/15* (2006.01)
(52) U.S. Cl.
USPC .................. 257/79; 257/40; 257/E51.022
(58) Field of Classification Search
USPC ........... 257/9–39, 79–103, E51.022; 313/506
See application file for complete search history.

(56) References Cited

U.S. PATENT DOCUMENTS

| | | | |
|---|---|---|---|
| 6,875,524 B2 * | 4/2005 | Hatwar et al. | 428/690 |
| 7,192,659 B2 | 3/2007 | Ricks et al. | |
| 7,737,625 B2 | 6/2010 | Arakane et al. | |
| 7,812,521 B2 | 10/2010 | Mori et al. | |
| 7,960,912 B2 * | 6/2011 | Yasukawa et al. | 313/506 |
| 8,035,297 B2 | 10/2011 | Arakane et al. | |
| 2004/0124766 A1 * | 7/2004 | Nakagawa et al. | 313/504 |
| 2006/0029828 A1 | 2/2006 | Kanno et al. | |
| 2006/0051615 A1 | 3/2006 | Kanno et al. | |
| 2006/0141287 A1 * | 6/2006 | Klubek et al. | 428/690 |
| 2007/0241676 A1 | 10/2007 | Park et al. | |

FOREIGN PATENT DOCUMENTS

| | | |
|---|---|---|
| JP | A-2006-66872 | 3/2006 |
| JP | A-2007-150191 | 6/2007 |
| JP | A-2007-287691 | 11/2007 |
| JP | A-2007-533157 | 11/2007 |
| JP | A-2009-43684 | 2/2009 |
| JP | A-2009-48828 | 3/2009 |
| WO | WO 2005/112518 A1 | 11/2005 |

OTHER PUBLICATIONS

Kuma, Hitoshi et al.; "47.5L: Late-News Paper: Highly Efficient White OLEDs Using RGB Fluorescent Materials", *SID 07 Digest*; 2007; pp. 1504-1507.

* cited by examiner

*Primary Examiner* — Laura M Menz
*Assistant Examiner* — Candice Y Chan
(74) *Attorney, Agent, or Firm* — Oliff & Berridge, PLC

(57) ABSTRACT

A light-emitting element includes a cathode; an anode; and a light-emitting section which is disposed between the cathode and the anode and which includes a first light-emitting layer, second light-emitting layer, and third light-emitting layer each containing a corresponding one of luminescent materials emitting light of different colors and host materials supporting the luminescent materials. The first, second, and third light-emitting layers commonly contain a first host material that is one of the host materials. The first light-emitting layer emits light of a first color having a longer wavelength as compared to light emitted from the second and third light-emitting layers and contains a second host material which is one of the host materials and which is different from the first host material. The second host material is superior in enhancing the luminescence of the first light-emitting layer to the first host material.

14 Claims, 5 Drawing Sheets

EXAMPLE

COMPARATIVE EXAMPLE

LIGHT-EMITTING ELEMENT, LIGHT-EMITTING DEVICE, DISPLAY, AND ELECTRONIC APPARATUS

BACKGROUND

1. Technical Field

The present invention relates to a light-emitting element, a light-emitting device, a display, and an electronic apparatus.

2. Related Art

An organic electroluminescent element, so-called an organic EL element, is a type of light-emitting element having a configuration in which at least one light-emitting organic layer is sandwiched between an anode and a cathode. In such a light-emitting element, electrons and holes are injected into a light-emitting layer from a cathode and an anode, respectively, by applying a voltage between the cathode and the anode; the electrons and the holes recombine with each other in the light-emitting layer to generate excitons; and the energy of the excitons is emitted in the form of light when the excitons return to the ground state.

A known example of the light-emitting element is a white light-emitting element which includes three light-emitting layers each corresponding to red, green, or blue to emit white light as disclosed in, for example, Japanese Unexamined Patent Application Publication No. 2007-287691 (hereinafter referred to as Patent Document) and Hitoshi Kuma, et al., *SID 07 DIGEST*, p. 1504, 2007 (hereinafter referred to as Non-patent Document). A full-color image can be displayed by the use of such white light-emitting elements in combination with a color filter having red, green, and blue portions corresponding to pixels.

In an light-emitting element disclosed in Patent Document, different host materials suitable for the luminescence of luminescent materials contained in light-emitting layers are used. Therefore, the migration of carriers (electrons and holes) is limited in the vicinity of boundaries between the light-emitting layers; hence, the driving voltage of the light-emitting element is likely to be increased.

In an light-emitting element disclosed in Non-patent Document, carriers (electrons and holes) can be restricted from migrating between light-emitting layers in such a manner that interlayers are arranged between the light-emitting layers, whereby the number of electrons and holes recombining with each other in each light-emitting layer is adjusted. This enhances the emission efficiency and emission lifetime of the light-emitting element. Since the light-emitting element includes the interlayers, the light-emitting element has a problem that the driving voltage thereof is likely to be increased.

SUMMARY

An advantage of some aspects of the present invention is to provide a light-emitting element having relatively low driving voltage and high emission efficiency, a highly reliable light-emitting device including the light-emitting element, a highly reliable display, and a highly reliable electronic apparatus.

A light-emitting element according to the present invention includes a cathode; an anode; and a light-emitting section which is disposed between the cathode and the anode and which includes a first light-emitting layer, second light-emitting layer, and third light-emitting layer each containing a corresponding one of luminescent materials emitting light of different colors and host materials supporting the luminescent materials. The first, second, and third light-emitting layers commonly contain a first host material that is one of the host materials. The first light-emitting layer emits light of a first color having a longer wavelength as compared to light emitted from the second and third light-emitting layers and contains a second host material which is one of the host materials and which is different from the first host material. The second host material is superior in enhancing the luminescence of the first light-emitting layer to the first host material. This allows the light-emitting element to have relatively low driving voltage and high emission efficiency.

In the light-emitting element, it is preferred that the energy gap of the second host material be less than the energy gap of the first host material and be greater than the energy gap of the luminescent material contained in the first light-emitting layer. This allows the first light-emitting layer to efficiently emit light and to have high emission efficiency.

In the light-emitting element, the content of the second host material in the first light-emitting layer is preferably less than the content of the first host material in the first light-emitting layer. This allows the first light-emitting layer to contain a sufficient amount of the first host material; hence, electrons and holes efficiently migrate between the adjacent first, second, and third light-emitting layers and therefore the light-emitting element has low driving voltage.

In the light-emitting element, the content of the second host material in the first light-emitting layer is preferably 10% to 49% by weight. This allows the second host material to fully exhibit its advantages and also allows the first light-emitting layer to contain a sufficient amount of the first host material.

In the light-emitting element, the first host material is preferably an anthracene compound. The anthracene compound has a relatively large energy gap and therefore can transfer the energy of excitons generated by the recombination of electrons and holes to the luminescent materials contained in the second and third light-emitting layers; hence, the second and third light-emitting layers can efficiently emit light. The anthracene compound has a function of transporting both holes and electrons.

In the light-emitting element, the first color is preferably red. Since the first host material, which has a relatively large energy gap, is used to allow the second and third light-emitting layers to efficiently emit light, the energy of excitons generated in the first host material is unlikely to be transferred to a red luminescent material. However, such a problem can be solved because the first light-emitting layer contains the second host material.

In the light-emitting element, the luminescent material contained in the first light-emitting layer is preferably a diindenoperylene derivative. The diindenoperylene derivative can efficiently emit light when the diindenoperylene derivative receives the energy of excitons generated in the first host material through the second host material. This allows the light-emitting element to have high emission efficiency.

In the light-emitting element, the second host material is preferably a naphthacene derivative. The use of the naphthacene derivative allows the energy of excitons generated in the second host material to be efficiently transferred to the luminescent material contained in the first light-emitting layer and also allows the energy of excitons generated in the first host material to be efficiently transferred to the luminescent material contained in the first light-emitting layer through the second host material. This allows the luminescent material contained in the first light-emitting layer to efficiently emit light and therefore allows the light-emitting element to have high emission efficiency.

In the light-emitting element, it is preferred that the first light-emitting layer have a function of capturing electrons and be located closer to the anode than the second and third light-emitting layers. This allows the first light-emitting layer to emit light even if the number of electrons in the first light-emitting layer is relatively small. Since the first light-emitting layer is located closer to the anode than the second and third light-emitting layers, the second and third light-emitting layers are supplied with a sufficient number of electrons and therefore can efficiently emit light and the first light-emitting layer can efficiently emit light. This allows the light-emitting element to have high emission efficiency.

The light-emitting layer has the above configuration and therefore has relatively low driving voltage and high emission efficiency.

A light-emitting device according to the present invention includes the light-emitting element. This allows the light-emitting device to have high emission efficiency and to operate at relatively low voltage.

A display according to the present invention includes the light-emitting device. This allows the display to operate at relatively low voltage, to provide a high-quality image, and to have high reliability.

An electronic apparatus according to the present invention includes the display. This allows the electronic apparatus to operate at relatively low voltage, to display a high-quality image, and to have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the present invention will now be described with reference to the accompanying drawings.

Figure 1:
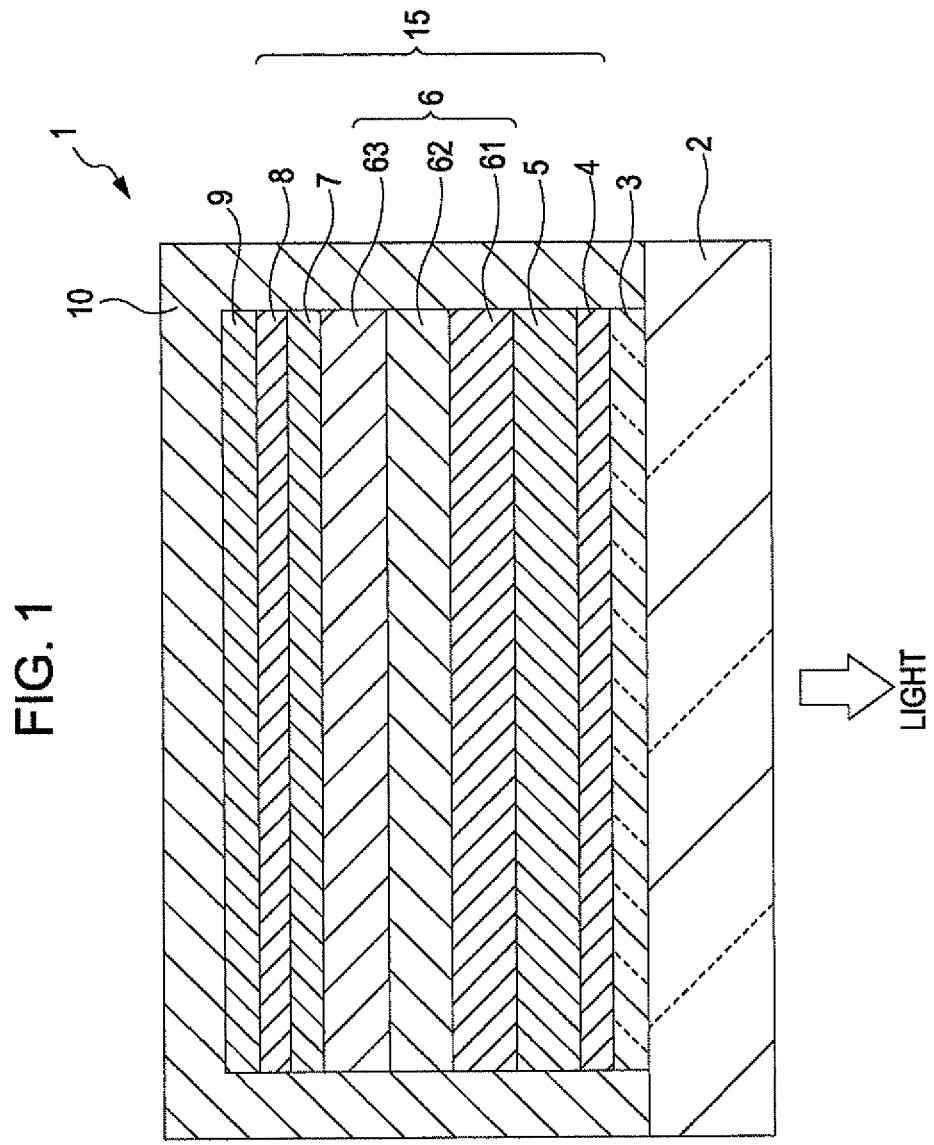
FIG. 1 is a schematic view of a light-emitting element according to a preferred embodiment of the present invention.

FIG. 1 is a schematic view of a light-emitting element 1 according to a preferred embodiment of the present invention. For convenience of description, the upper side and lower side of FIG. 1 are hereinafter referred to as an "upper side" and a "lower side", respectively. That is, in FIG. 1, the substrate 2 side and cathode 9 side of the light-emitting element 1 are referred to as an upper side and a lower side, respectively.

The light-emitting element 1 corresponds to an electroluminescent element and is an organic electroluminescent element that contains organic luminescent materials each emitting a corresponding one of red light, green light, and blue light so as to emit white light.

With reference to FIG. 1, the light-emitting element 1 includes a anode 3, a hole injection layer 4, a hole transport layer 5, a light-emitting section 6, an electron transport layer 7, an electron injection layer 8, and a cathode 9 arranged in that order. The light-emitting section 6 includes a red light-emitting layer 61, a blue light-emitting layer 62, and a green light-emitting layer 63 arranged from the anode 3 toward the cathode 9 in that order. The red, blue, and green light-emitting layers 61, 62, and 63 are in contact with one another. The red light-emitting layer 61, the blue light-emitting layer 62, and the green light-emitting layer 63 correspond to a first light-emitting layer, a second light-emitting layer, and a third light-emitting layer, respectively.

In other words, the light-emitting element 1 includes a laminate 15 which includes the hole injection layer 4, the hole transport layer 5, the light-emitting section 6, the electron transport layer 7, the electron injection layer 8 arranged in that order and which is sandwiched between two electrodes: the anode 3 and the cathode 9.

The light-emitting element 1 is disposed on a substrate 2 and is entirely sealed with a sealing member 10.

In the light-emitting element 1, electrons and holes are supplied (injected) to the light-emitting section 6, which includes the red, blue, and green light-emitting layers 61, 62, and 63 from the cathode 9 and the anode 3, respectively, by applying a driving voltage between the cathode 9 and the anode 3. In each of the red, blue, and green light-emitting layers 61, 62, and 63, the holes and the electrons recombine with each other, excitons are generated by energy released by the recombination thereof, and energy (fluorescent or phosphorescent light) is released (emitted) when the excitons return to the ground state. This allows the light-emitting element 1 to emit white light.

The substrate 2 supports the anode 3. The light-emitting element 1 has a configuration in which light is extracted through the substrate 2. That is, the light-emitting element 1 is of a bottom emission type. Therefore, the substrate 2 and the anode 3 are substantially transparent. That is, the substrate 2 and the anode 3 are colored or colorless and transparent or are translucent.

Examples of a material for forming the substrate 2 include resin materials such as polyethylene terephthalate, polyethylene naphthalate, polypropylene, cyclo-olefin polymers, polyamide, polyethersulfone, poly(methyl methacrylate), polycarbonate, and polyarylate and glass materials such as quartz glass and soda glass. These materials may be used alone or in combination.

The average thickness of the substrate 2 is not particularly limited and is preferably about 0.1 to 30 mm and more preferably about 0.1 to 10 mm.

When the light-emitting element 1 has a configuration in which light is extracted from the side opposite to the substrate 2, that is, when the light-emitting element 1 is of a top emission type, the substrate 2 may be a transparent or opaque substrate.

Examples of the opaque substrate include substrates made of a ceramic material such as alumina; metal substrates, made of stainless steel, having oxide films or insulating layers thereon; and substrates made of resin.

Members of the light-emitting element 1 are described below.

The anode 3 is an electrode for injecting holes into the hole transport layer 5 through the hole injection layer 4. A material for forming the anode 3 preferably has a large work function and high conductivity.

Examples of the material for forming the anode 3 include oxides such as indium tin oxide (ITO), indium zinc oxide (IZO), $In_2O_3$, $SnO_2$, Sb-containing $SnO_2$, and Al-containing ZnO; metals such as Au, Pt, Ag, and Cu; and alloys containing these metals. These materials may be used alone or in combination.

The average thickness of the anode 3 is not particularly limited and is preferably about 10 to 200 nm and more preferably about 50 to 150 nm.

The cathode 9 is an electrode for injecting electrons into the electron transport layer 7 through the electron injection layer 8. A material for forming the cathode 9 preferably has a small work function.

Examples of the material for forming the cathode 9 include metals such as Li, Mg, Ca, Sr, La, Ce, Er, Eu, Sc, Y, Yb, Ag, Cu, Al, Cs, and Rb and alloys containing these metals. These materials may be used alone or in combination. The cathode 9 may include, for example, a plurality of layers each made of a corresponding one of these materials.

The cathode 9 is preferably made of an alloy containing a stable metal element such as Ag, Al, or Cu and more preferably an alloy such as Mg—Ag, Al—Li, or Cu—Li in particular. The use of such an alloy to form the cathode 9 allows the electron injection efficiency and stability of the cathode 9 to be enhanced.

The average thickness of the cathode 9 is not particularly limited and is preferably about 50 to 10,000 nm and more preferably about 100 to 500 nm.

Since the light-emitting element 1 is of a bottom emission type, the cathode 9 need not be particularly transparent.

The hole injection layer 4 has a function of enhancing the injection efficiency of holes transported from the anode 3.

A material for forming the hole injection layer 4, that is, a hole-injecting material used is not particularly limited. Examples of such a material include copper phthalocyanine, 4,4',4''-tris(N,N-phenyl-3-methylphenylamino)triphenylamine (m-MTDATA), and N,N'-bis(4-diphenylamino-phenyl)-N,N'-diphenyl-biphenyl-4-4'-diamine having the following formula:

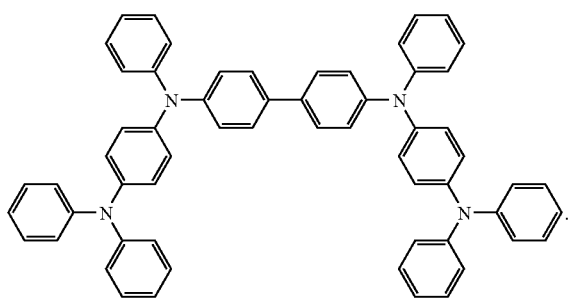

(I)

The average thickness of the hole injection layer 4 is not particularly limited and is preferably about 5 to 150 nm and more preferably about 10 to 100 nm.

The hole injection layer 4 is omissible.

The hole transport layer 5 has a function of transporting holes, injected thereinto from the anode 3 through the hole injection layer 4, to the red light-emitting layer 61.

The hole transport layer 5 may be made of one or more of various p-type high- and low-molecular weight materials. Examples of a material for forming the hole transport layer 5 include tetraaryldiaminofluorenes, derivatives (amine compounds) of the tetraaryldiaminofluorenes, and tetraarylbenzidine derivatives such as N,N'-diphenyl-N,N'-bis(3-methylphenyl)-1,1'-diphenyl-4,4'-diamine (TPD) and N,N'-di(1-naphtyl)-N,N'-diphenyl-1,1'-diphenyl-4,4'-diamine (α-NPD) having the following formula:

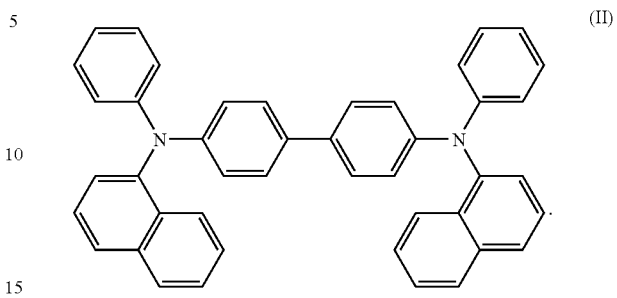

(II)

These compounds may be used alone or in combination.

The average thickness of the hole transport layer 5 is not particularly limited and is preferably about 10 to 150 nm and more preferably about 10 to 100 nm.

The hole transport layer 5 is omissible.

The light-emitting section 6 includes the red light-emitting layer 61 (first light-emitting layer), the blue light-emitting layer 62 (second light-emitting layer), and the green light-emitting layer 63 (third light-emitting layer) arranged from the anode 3 toward the cathode 9 as described above.

The red, blue, and green light-emitting layers 61, 62, and 63 contain luminescent materials emitting light of different colors and host materials supporting the luminescent materials.

The host materials have a function of allowing holes and electrons to recombine with each other to generate excitons and a function of transferring the excitons to the luminescent materials (Forster or Dexter transfer) to excite the luminescent materials.

The luminescent materials and the host materials can be used in such a manner that each host material is doped with a corresponding one of the luminescent materials, which serve as guest materials or dopants.

The red, blue, and green light-emitting layers 61, 62, and 63 commonly contain a first host material that is one of the host materials. Since the red, blue, and green light-emitting layers 61, 62, and 63 commonly contain the first host material, the injection barrier of carriers (holes and electrons) migrating between the red, blue, and green light-emitting layers 61, 62, and 63 is low. This allows the driving voltage of the light-emitting element 1 to be relatively low.

Light emitted from the red light-emitting layer 61 (first light-emitting layer) has a wavelength longer than that of light emitted from the blue and green light-emitting layers 62 and 63. Therefore, a red luminescent material contained in the red light-emitting layer 61 has an energy gap less than those of the luminescent materials contained in the blue and green light-emitting layers 62 and 63. In order to allow the blue and green light-emitting layers 62 and 63 to sufficiently emit light, the first host material needs to have a sufficiently large energy gap. The direct transfer of the energy of excitons generated in the first host material, which has such a large energy gap, to the red luminescent material, which has such a relatively small energy gap, causes a reduction in the emission efficiency of the red light-emitting layer 61.

Therefore, the red light-emitting layer 61 contains a second host material in addition to the first host material, the second host material being superior in enhancing the luminescence of the red luminescent material, which is contained in the red light-emitting layer 61, to the first host material. This allows the energy of the excitons generated in the second host material to be efficiently transferred to the red luminescent material in the red light-emitting layer 61. The energy of excitons generated in the first host material can be efficiently transferred to the red luminescent material in the red light-emitting layer 61. Therefore, light can be efficiently emitted from the red luminescent material. This allows the light-emitting element 1 to have sufficiently high emission efficiency.

The red light-emitting layer 61 (first light-emitting layer) contains the red luminescent material and the first and second host materials. The red luminescent material corresponds to a first luminescent material and emits red light, that is, light of a first color.

The red luminescent material is not particularly limited and may be one or more selected from red fluorescent materials and red phosphorescent materials.

The red fluorescent materials emit red fluorescent light and are not particularly limited. Examples of the red fluorescent materials include europium complexes, benzopyran derivatives, rhodamine derivatives, benzothioxantene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizine-9-yl)ethenyl)-4H-pyran-4H-ylidene)propane-dinitrile (DCJTB), 4-(dicyanomethylene)-2-methyl-6-(p-dimethylaminostyryl)-4H-pyran (DCM), and diindenoperylene derivatives such as a tetraaryldiindenoperylene derivative having the following formula:

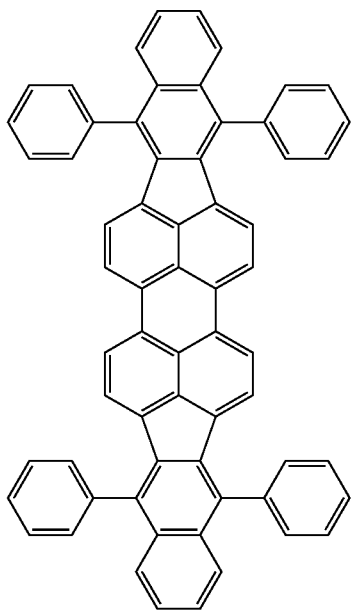

(III)

The red phosphorescent materials emit red phosphorescent light and are not particularly limited. Examples of the red phosphorescent materials include metal complexes containing a metal such as iridium, ruthenium, platinum, osmium, rhenium, or palladium and a ligand having a phenylpyridine ring, a bipyridyl ring, or a porphyrin ring. Particular examples of the red phosphorescent materials include tris(1-phenylisoquinoline) iridium, bis[2-(2'-benzo[4,5-α]thienyl) pyridinate-N,C$^{3'}$] iridium (acetylacetonate) (btp2Ir(acac)), 2,3,7,8,12,13,17,18-octaethyl-12H, 23H-porphyrin-platinum(II), bis [2-(2'-benzo[4,5-α]thienyl) pyridinate-N,C$^{3'}$] iridium, and bis(2-phenylpyridine) iridium (acetylacetonate).

In particular, the red luminescent material is preferably one of the diindenoperylene derivatives and more preferably the tetraaryldiindenoperylene derivative having Formula (III). Such a compound can efficiently emit light when the compound receives the energy of the excitons generated in the first host material from the second host material.

The content (doping amount) of the red luminescent material in the red light-emitting layer 61 is preferably 0.01% to 10% by weight and more preferably 0.1% to 5% by weight. When the content of the red luminescent material is within such a range, the emission efficiency of the red light-emitting layer 61 can be optimized. This allows the red light-emitting layer 61 to emit light with a good balance with the light emission of the blue and green light-emitting layers 62 and 63.

The red light-emitting layer 61 contains the first and second host materials.

The first host material is not particularly limited. When the red luminescent material is at least one of the red fluorescent materials, the first host material is, for example, at least one selected from the group consisting of distyrylarylene derivatives, anthracene compounds such as an anthracene compound having Formula (IV) below and 2-t-butyl-9,10-di(2-naphthyl)anthracene (TBADN), perylene derivatives, distyrylbenzene derivatives, distyrylamine derivatives, quinolinolato metal complexes such as tris(8-quinolinolato) aluminum (Alq3), triarylamine derivatives such as a tetramer of triphenylamine, oxadiazole derivatives, naphthacene, naphthacene derivatives such as a naphthacene derivative having Formula (V) below, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi):

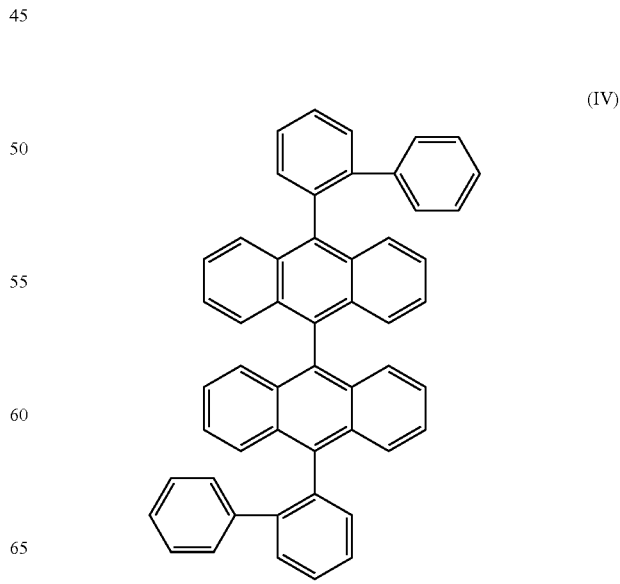

(IV)

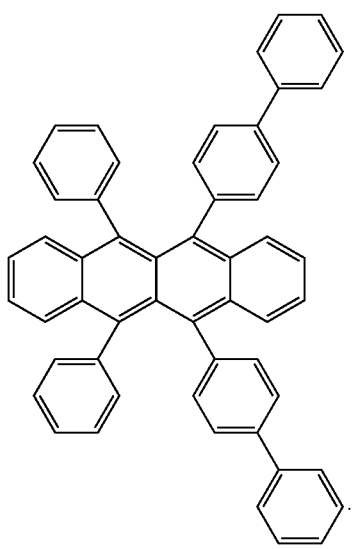

(V)

When the red luminescent material is at least one of the red phosphorescent materials, the first host material is, for example, a carbazole derivative such as 3-phenyl-4-(1'-naphtyl)-5-pheylcarbazole or 4,4'-N,N'-dicarbazole biphenyl (CBP).

In particular, the first host material is one of the anthracene compounds and more preferably the anthracene compound having Formula (IV). The anthracene compounds have a relatively large energy gap and can transfer the energy of excitons generated by the recombination of electrons and holes to a green luminescent material and blue luminescent material described below; hence, the blue and green light-emitting layers 62 and 63 can efficiently emit light. The anthracene compounds have the ability to transfer electrons and holes.

The first host material preferably has an energy gap of 2.7 to 3.7 eV and more preferably 3.1 to 3.5 eV. This allows the energy of excitons generated by the recombination of electrons and holes to be sufficiently transferred to the green luminescent material and the blue luminescent material; hence, the blue and green light-emitting layers 62 and 63 can efficiently emit light.

The content of the first host material in the red light-emitting layer 61 is preferably 41% to 90% by weight. This allows carriers (electrons and holes) to migrate efficiently between the red light-emitting layer 61 and the blue light-emitting layer 62, which is next to the red light-emitting layer 61; hence, the light-emitting element 1 has a reduced driving voltage.

The second host material is superior in enhancing the luminescence of the red luminescent material, which is contained in the red light-emitting layer 61, to the first host material as described above and is not particularly limited. The second host material can be selected from the above examples of the first host material.

In particular, the substrate 2 is preferably one of the above naphtacene derivatives and more preferably the naphthacene derivative having Formula (V). The naphthacene derivatives can efficiently transfer the energy of excitons generated in the second host material to the red luminescent material and also can efficiently transfer the energy of excitons generated in the first host material to the red luminescent material through the second host material. This allows the red luminescent material to efficiently emit light. Such an advantage is remarkable when the red luminescent material and the second host material are the tetraaryldiindenoperylene derivative having Formula (III) and the naphthacene derivative having Formula (V), respectively.

The second host material preferably has an energy gap of 2.1 to 2.8 eV and more preferably 2.2 to 2.6 eV. This allows the energy of the excitons generated in the second host material to be efficiently transferred to the red luminescent material and also allows the energy of the excitons generated in the first host material to be efficiently transferred to the red luminescent material through the second host material.

The energy gap of the second host material is preferably less than that of the first host material and greater than that of the red luminescent material (first luminescent material). This allows the energy of the excitons generated in the second host material to be efficiently transferred to the red luminescent material and also allows the energy of the excitons generated in the first host material to be efficiently transferred to the red luminescent material through the second host material.

The difference in energy gap between the second host material and the red luminescent material is preferably 0.5 eV or less and more preferably 0.4 eV or less. This allows the energy of the excitons generated in the second host material to be efficiently transferred to the red luminescent material.

The content of the second host material in the red light-emitting layer 61 is preferably less than that of the first host material therein. This allows the red light-emitting layer 61 to contain a sufficient amount of the first host material; hence, electrons and holes migrate efficiently between the red light-emitting layer 61 and the blue light-emitting layer 62, which is next to the red light-emitting layer 61. Therefore, the light-emitting element 1 has a reduced driving voltage.

The content of the second host material in the red light-emitting layer 61 is preferably 10% to 49% by weight and more preferably 15% to 45% by weight. This allows advantages of the second host material to be fully exploited and also allows the red light-emitting layer 61 to contain a sufficient amount of the first host material.

The average thickness of the red light-emitting layer 61 is not particularly limited and is preferably about 5 to 50 nm and more preferably about 10 to 40 nm.

When the red light-emitting layer 61 has a function of capturing electrons, the red light-emitting layer 61 can emit light even if the number of electrons therein is small. The other light-emitting layers, that is, the blue and green light-emitting layers 62 and 63 are supplied with a sufficient number of electrons and therefore can efficiently emit light and the red light-emitting layer 61 also can efficiently emit light because the red light-emitting layer 61 is located closer to the anode 3 than the blue and green light-emitting layers 62 and 63. This allows the light-emitting element 1 to have sufficiently high emission efficiency. Furthermore, electrons can be prevented from migrating from the red light-emitting layer 61 to the anode 3 and therefore the hole injection layer 4 and the hole transport layer 5, which are located closer to the anode 3 than the red light-emitting layer 61, from being deteriorated. When the red luminescent material is one of the diindenoperylene derivatives or particularly the tetraaryldiindenoperylene derivative having Formula (III), the red light-emitting layer 61 has a function of capturing electrons.

The blue light-emitting layer 62 (second light-emitting layer) contains the blue luminescent material and the first host material. The blue luminescent material corresponds to a second luminescent material and emits blue light, that is, light of a second color.

The blue luminescent material is not particularly limited and may be one or more selected from blue fluorescent materials and blue phosphorescent materials.

The blue fluorescent materials emit blue fluorescent light and are not particularly limited. Examples of the blue fluorescent materials include fluoranthene derivatives, pyrene derivatives, perylene, perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}phenylene-1,4-diyl)], poly[(9,9-dioctylfluorene-2,7-diyl)-co-(ethynylbenzene)], and distyrylamine derivatives such as a distyrylamine compound having the following formula:

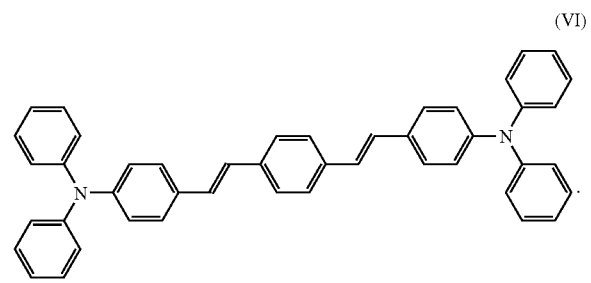 [SMILES: C(=C\c1ccc(N(c2ccccc2)c2ccccc2)cc1)/c1ccc(/C=C/c2ccc(N(c3ccccc3)c3ccccc3)cc2)cc1]

(VI)

These compounds may be used alone or in combination.

The blue phosphorescent materials emit blue phosphorescent light and are not particularly limited. Examples of the blue phosphorescent materials include metal complexes containing iridium, ruthenium, platinum, osmium, rhenium, or palladium. Particular examples of the blue phosphorescent materials include bis[4,6-difluorophenylpyridinate-N,$C^{2'}$]-picolinate-iridium, tris[2-(2,4-difluorophenyl) pyridinate-N,$C^{2'}$]-iridium, bis[2-(3,5-trifluoromethyl) pyridinate-N,$C^{2'}$]-picolinate-iridium, and bis(4,6-difluorophenylpyridinate-N,$C^{2'}$) iridium (acetylacetonate).

The content (doping amount) of the blue luminescent material in the blue light-emitting layer 62 is preferably 0.01% to 20% by weight and more preferably 1% to 15% by weight. When the content of the blue luminescent material is within such a range, the emission efficiency of the blue light-emitting layer 62 can be optimized. This allows the blue light-emitting layer 62 to emit light with a good balance with the light emission of the red and green light-emitting layers 61 and 63.

The first host material is as described about the red light-emitting layer 61.

The first host material is preferably a principal content of the blue light-emitting layer 62. In particular, the content of the first host material in the blue light-emitting layer 62 is preferably 70% or more, more preferably 80% or more, and further more preferably 90% or more on a weight basis. This allows electrons and holes to migrate efficiently between the red, blue, and green light-emitting layers 61, 62, and 63; hence, the light-emitting element 1 has a reduced driving voltage.

The average thickness of the blue light-emitting layer 62 is not particularly limited and is preferably about 5 to 50 nm and more preferably about 10 to 40 nm.

The green light-emitting layer 63 (third light-emitting layer) contains the green luminescent material and the first host material. The green luminescent material corresponds to a third luminescent material and emits green light, that is, light of a third color.

The green luminescent material is not particularly limited and may be one or more selected from green fluorescent materials and green phosphorescent materials.

The green fluorescent materials emit green fluorescent light and are not particularly limited. Examples of the green fluorescent materials include coumarin derivatives, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene], poly[(9,9-dioctyl-2,7-divinylenefluorenylene)-ortho-co-(2-methoxy-5-(2-ethoxylhexyloxy)-1,4-phenylene)], quinacridone, and quinacridone derivatives such as a quinacridone derivative having the following formula:

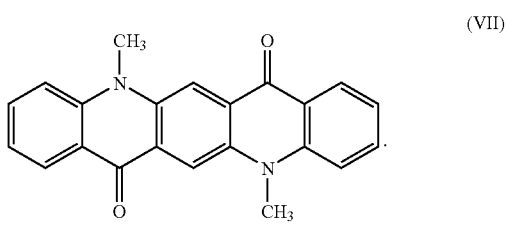 [SMILES: Cn1c2ccccc2c(=O)c2cc3c(cc21)c(=O)c1ccccc1n3C]

(VII)

These compounds may be used alone or in combination.

The green phosphorescent materials emit green phosphorescent light and are not particularly limited. Examples of the green phosphorescent materials include metal complexes containing a metal such as iridium, ruthenium, platinum, osmium, rhenium, or palladium and a ligand having a phenylpyridine ring, a bipyridyl ring, or a porphyrin ring. Particular examples of the green phosphorescent materials include fac-tris(2-phenylpyridine) iridium (Ir(ppy)$_3$), bis(2-phenylpyridinate-N,$C^{2'}$) iridium (acetylacetonate), and fac-tris[5-fluoro-2-(5-fluoromethyl-2-pyridine) phenyl-C,N] iridium.

The content (doping amount) of the green luminescent material in the green light-emitting layer 63 is preferably 0.01% to 20% by weight and more preferably 0.1% to 15% by weight. When the content of the green luminescent material is within such a range, the emission efficiency of the green light-emitting layer 63 can be optimized. This allows the green light-emitting layer 63 to emit light with a good balance with the light emission of the red and blue light-emitting layers 61 and 62.

The first host material is as described about the red light-emitting layer 61.

The first host material is preferably a principal content of the green light-emitting layer 63. In particular, the content of the first host material in the green light-emitting layer 63 is preferably 70% or more, more preferably 80% or more, and further more preferably 90% or more on a weight basis. This allows electrons and holes to migrate efficiently between the red, blue, and green light-emitting layers 61, 62, and 63; hence, the light-emitting element 1 has a reduced driving voltage.

The average thickness of the green light-emitting layer 63 is not particularly limited and is preferably about 5 to 50 nm and more preferably about 10 to 40 nm.

The electron transport layer 7 has a function of transporting electrons, injected thereinto from the cathode 9 through the electron injection layer 8, to the green light-emitting layer 63.

Examples of a material for forming the electron transport layer 7, that is, examples of an electron-transporting material include oxadiazole derivatives; perylene derivatives; pyridine derivatives; pyrimidine derivatives; quinoxaline derivatives; diphenylquinone derivatives; nitro-substituted fluorene derivatives; and quinoline derivatives such as organic metal complexes, containing a ligand such as 8-quinolinol or an 8-quinolinol derivative, including tris(8-quinolinolato) aluminum (Alq3) having the following formula:

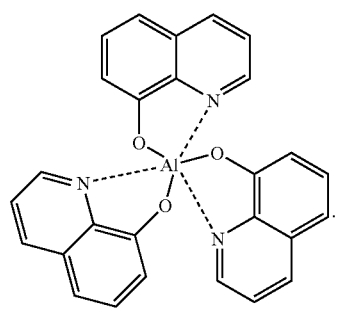

(VIII)

These compounds may be used alone or in combination.

The average thickness of the electron transport layer 7 is not particularly limited and is preferably about 0.5 to 100 nm and more preferably about 1 to 50 nm.

The electron injection layer 8 has a function of enhancing the injection efficiency of electrons transported from the cathode 9.

Examples of a material for forming the electron injection layer 8, that is, examples of an electron-injecting material include various inorganic insulating materials and inorganic semiconductor materials.

Examples of the inorganic insulating materials include alkali metal chalcogenides such as alkali metal oxides, alkali metal sulfide, alkali metal selenides, and alkali metal tellurides; alkaline-earth metal chalcogenides; alkali metal halides; and alkaline-earth metal halides. These compounds may be used alone or in combination. The use of at least one of these compounds to form the electron injection layer 8 leads to an enhancement in electron injection. In particular, alkali metal compounds such as the alkali metal chalcogenides and the alkali metal halides have an extremely low work function. Therefore, the use of at least one of the alkali metal compounds to form the electron injection layer 8 allows the light-emitting element 1 to have high brightness.

Examples of the alkali metal chalcogenides include $Li_2O$, LiO, $Na_2S$, $Na_2Se$, and NaO.

Examples of the alkaline-earth metal chalcogenides include CaO, BaO, SrO, BeO, BaS, MgO, and CaSe.

Examples of the alkali metal halides include CsF, LiF, NaF, KF, LiCl, KCl, and NaCl.

Examples of the alkaline-earth metal halides include $CaF_2$, $BaF_2$, $SrF_2$, $MgF_2$, and $BeF_2$.

Examples of the inorganic semiconductor materials include oxides, nitrides, and oxynitrides containing at least one selected from the group consisting of Li, Na, Ba, Ca, Sr, Yb, Al, Ga, In, Cd, Mg, Si, Ta, Sb, and Zn. These compounds may be used alone or in combination.

The average thickness of the electron injection layer 8 is not particularly limited and is preferably about 0.1 to 1,000 nm, more preferably about 0.2 to 100 nm, and further more preferably about 0.2 to 50 nm.

The sealing member 10 covers the anode 3, the laminate 15, and the cathode 9 and has a function of hermetically sealing the anode 3, the laminate 15, and the cathode 9 to block oxygen and moisture. The presence of the sealing member 10 allows the light-emitting element 1 to have increased reliability and durability and prevents the degradation and/or deterioration of the light-emitting element 1.

Examples of a material for forming the sealing member 10 include metals such as Al, Au, Cr, Nb, Ta, and Ti; alloys containing these metals; silicon dioxide; and various resins. In the case of using a conductive material to form the sealing member 10, insulating films for preventing short-circuits are preferably provided between the sealing member 10, the anode 3, the laminate 15, and the cathode 9 as required.

The sealing member 10 may be tabular and may be placed opposite the substrate 2. In this case, a region between the sealing member 10 and the substrate 2 may be sealed with a sealant.

According to the light-emitting element 1, the red, blue, and green light-emitting layers 61, 62, and 63 commonly contain the first host material and therefore electrons and holes migrate efficiently between the red, blue, and green light-emitting layers 61, 62, and 63. This allows the light-emitting element 1 to have a low driving voltage. The red light-emitting layer 61 contains the second host material in addition to the first host material. This allows the red luminescent material to efficiently emit light and also allows the light-emitting element 1 to have high emission efficiency. The light-emitting element 1 can efficiently emit light at a low voltage and therefore has a long emission lifetime.

The light-emitting element 1 can be manufactured as described below.

The substrate 2 is prepared. The anode 3 is formed on the substrate 2.

The anode 3 can be formed by, for example, a chemical vapor deposition (CVD) process such as plasma-enhanced CVD or thermal CVD, a dry plating process such as vacuum vapor deposition, a wet plating process such as electroplating, a spraying process, a sol-gel process, a MOD process, or the bonding of a metal foil.

The hole injection layer 4 is formed on the anode 3.

The hole injection layer 4 can be formed by a vapor-phase process such as a CVD process or a dry plating process including vacuum vapor deposition and sputtering.

Alternatively, the hole injection layer 4 can be formed in such a manner that, for example, a hole injection layer-forming composition prepared by dissolving the material for forming the hole injection layer 4 in a solvent or dispersing the material for forming the hole injection layer 4 in a dispersion medium is provided on the anode 3 and then subjected to drying, that is, the removal of the solvent or the dispersion medium.

The hole injection layer-forming composition can be provided on the anode 3 by a coating process such as a spin coating process, a roll-coating process, or an ink jet printing process. The use of such a coating process allows the hole injection layer 4 to be relatively readily formed.

Examples of the solvent or dispersion medium used to prepare the hole injection layer-forming composition include various organic solvents, various inorganic solvents, and mixtures of the organic and inorganic solvents.

The hole injection layer-forming composition can be dried in such a manner that the hole injection layer-forming composition is left in an atmosphere maintained at an atmospheric or reduced process, is heated, or is treated by inert-gas blasting.

In advance of this step, the upper surface of the anode 3 may be subjected to oxygen plasma treatment. This allows the upper surface of the anode 3 to be rendered lyophilic, allows organic substances adhering on the upper surface of the anode 3 to be removed or cleaned off, and allows the work function of a region near the upper surface of the anode 3 to be adjusted.

Conditions of the oxygen plasma treatment are preferably as follows: for example, a plasma power of about 100 to 800 W, an oxygen gas flow rate of about 50 to 100 mL/minute, a treated member (anode 3)—conveying speed of about 0.5 to 10 mm/s, and a substrate 2—temperature of about 70° C. to 90° C.

The hole transport layer 5 is formed on the hole injection layer 4.

The hole transport layer 5 can be formed by a vapor-phase process such as a CVD process or a dry plating process including vacuum vapor deposition and sputtering.

Alternatively, the hole transport layer 5 can be formed in such a manner that, for example, a hole transport layer-forming composition prepared by dissolving the material for forming the hole transport layer 5 in a solvent or dispersing the material for forming the hole transport layer 5 in a dispersion medium is provided on the hole injection layer 4 and then subjected to drying, that is, the removal of the solvent or the dispersion medium.

The red light-emitting layer 61 is formed on the hole transport layer 5.

The red light-emitting layer 61 can be formed by a vapor-phase process such as a CVD process or a dry plating process including vacuum vapor deposition and sputtering.

The blue light-emitting layer 62 is formed on the red light-emitting layer 61.

The blue light-emitting layer 62 can be formed by a vapor-phase process such as a CVD process or a dry plating process including vacuum vapor deposition and sputtering.

The green light-emitting layer 63 is formed on the blue light-emitting layer 62.

The green light-emitting layer 63 can be formed by a vapor-phase process such as a CVD process or a dry plating process including vacuum vapor deposition and sputtering.

The electron transport layer 7 is formed on the green light-emitting layer 63.

The electron transport layer 7 can be formed by a vapor-phase process such as a CVD process or a dry plating process including vacuum vapor deposition and sputtering.

Alternatively, the electron transport layer 7 can be formed in such a manner that, for example, an electron transport layer-forming composition prepared by dissolving the material for forming the electron transport layer 7 in a solvent or dispersing the material for forming the electron transport layer 7 in a dispersion medium is provided on the green light-emitting layer 63 and then subjected to drying, that is, the removal of the solvent or the dispersion medium.

The electron injection layer 8 is formed on the electron injection layer 8.

In the case of using an inorganic material to form the electron injection layer 8, the electron injection layer 8 can be formed by a vapor-phase process such as a CVD process or a dry plating process including vacuum vapor deposition and sputtering or in such a manner that a fine inorganic particle-containing ink is applied to the electron transport layer 7 and then fired.

The cathode 9 is formed on the electron injection layer 8.

The cathode 9 can be formed by a vacuum vapor deposition or a sputtering process or in such a manner that a metal foil is bonded to the electron injection layer 8 or a fine metal particle-containing ink is applied to the electron injection layer 8 and then fired.

The light-emitting element 1 is obtained through the above steps.

In final, the sealing member 10 is provided over the light-emitting element 1 and then bonded to the substrate 2.

A light-emitting device according to an embodiment of the present invention includes the light-emitting element 1.

Since the light-emitting device includes the light-emitting element 1, the light-emitting device operates at a relatively low voltage and has high emission efficiency and high reliability.

The light-emitting device can be used as, for example, a light source used for illumination.

A light-emitting device according to another embodiment of the present invention includes a plurality of light-emitting elements identical to the light-emitting element 1 and can be used for displays.

A display 100 according to an embodiment of the present invention will now be described.

Figure 2:
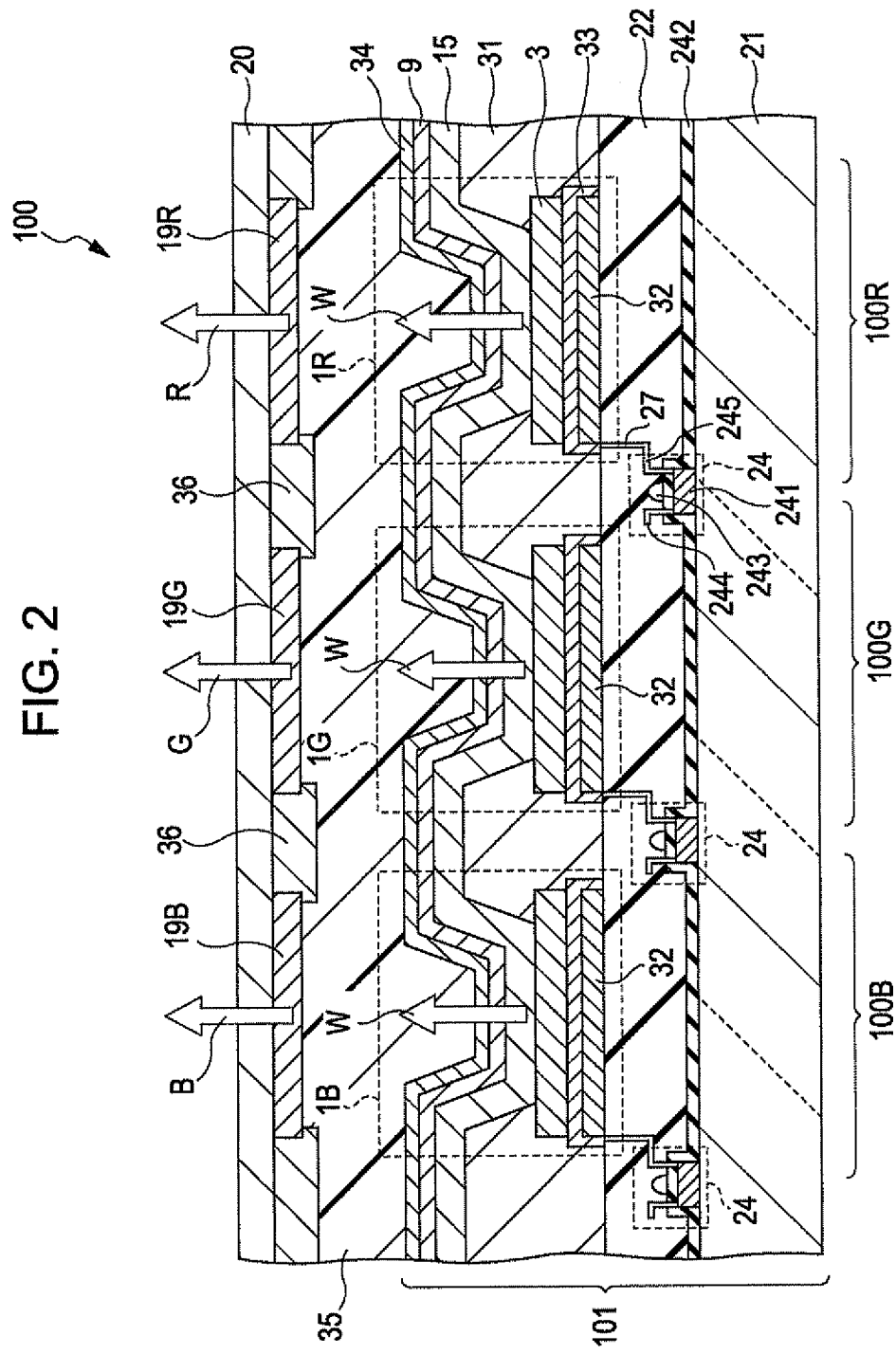
FIG. 2 is a vertical sectional view of a display according to a preferred embodiment of the present invention.

FIG. 2 is a vertical sectional view of the display 100.

With reference to FIG. 2, the display 100 includes a light-emitting device 101 including first light-emitting elements 1R, second light-emitting elements 1G, and third light-emitting elements 1B corresponding to red sub-pixels 100R, green sub-pixels 100G, and blue sub-pixels 100B, respectively, and also includes red color filters 19R, green color filters 19G, and blue color filters 19B. The display 100 is a top emission-type display panel. A scheme used to address the display 100 is not particularly limited and may be an active or passive matrix addressing scheme.

The light-emitting device 101 includes a substrate 21 and a plurality of driving transistors 24 in addition to the first, second, and third light-emitting elements 1R, 1G, and 1B.

The driving transistors 24 are arranged on the substrate 21. A planarization layer 22 made of an insulating material extends over the driving transistors 24.

The driving transistors 24 each include a semiconductor layer 241 made of silicon, a gate-insulating layer 242 disposed on the semiconductor layer 241, a gate electrode 243 disposed on the gate-insulating layer 242, a source electrode 244, and a drain electrode 245.

The first, second, and third light-emitting elements 1R, 1G, and 1B are arranged on the planarization layer 22 so as to correspond to the driving transistors 24.

In each of the first light-emitting elements 1R, the following members are arranged on the planarization layer 22 in this order: a reflective layer 32, an anti-corrosion layer 33, an anode 3, a portion of a laminate (organic EL section) 15, a portion of a cathode 9, and a portion of a cathode cover 34. The second and third light-emitting elements 1G and 1B have the same configuration as that of the first light-emitting elements 1R. In this embodiment, the anodes 3 of the first, second, and third light-emitting elements 1R, 1G, and 1B serve as pixel electrodes and are electrically connected to the drain electrodes 245 of the driving transistors 24 through conductive portions (interconnects) 27. The cathode 9 serves as a common electrode for the first, second, and third light-emitting elements 1R, 1G, and 1B.

In FIG. 2, the same members or components as those shown in FIG. 1 are denoted by the same reference numerals as those used in FIG. 1. The reflective layers 32 may have different configurations or properties among the first, second, and third light-emitting elements 1R, 1G, and 1B depending on the wavelength of light emitted therefrom.

Separators 31 are arranged between the adjacent first, second, and third light-emitting elements 1R, 1G, and 1B.

An epoxy layer 35 made of an epoxy resin extends over the light-emitting device 101.

The red color filters 19R, the green color filters 19G, and the blue color filters 19B are arranged on the epoxy layer 35 so as to correspond to the first light-emitting elements 1R, the second light-emitting elements 1G, and the third light-emitting elements 1B, respectively.

The red color filters 19R convert white light W emitted from the first light-emitting elements 1R into red light. The green color filters 19G convert white light W emitted from the second light-emitting elements 1G into green light. The blue color filters 19B convert white light W emitted from the third light-emitting elements 1B into blue light. The use of the red, green, and blue color filters 19R, 19G, and 19B in combination with the first, second, and third light-emitting elements 1R, 1G, and 1B enables the display of a full-color image.

Light-shielding layers 36 are arranged between the adjacent red, green, and blue color filters 19R, 19G, and 19B. This prevents the unintended red, green, and blue sub-pixels 100R, 100G, and 100B from emitting light.

A sealing substrate 20 extends over the red, green, and blue color filters 19R, 19G, and 19B and the light-shielding layers 36.

The selection of luminescent materials used for the first, second, and third light-emitting elements 1R, 1G, and 1B allows the display 100 to display a monochrome or color image.

Since the display 100 includes the first, second, and third light-emitting elements 1R, 1G, and 1B, the display 100 operates at a relatively low voltage and has high emission efficiency. Therefore, the display 100 can display a high-quality image with low power consumption.

Figure 3:
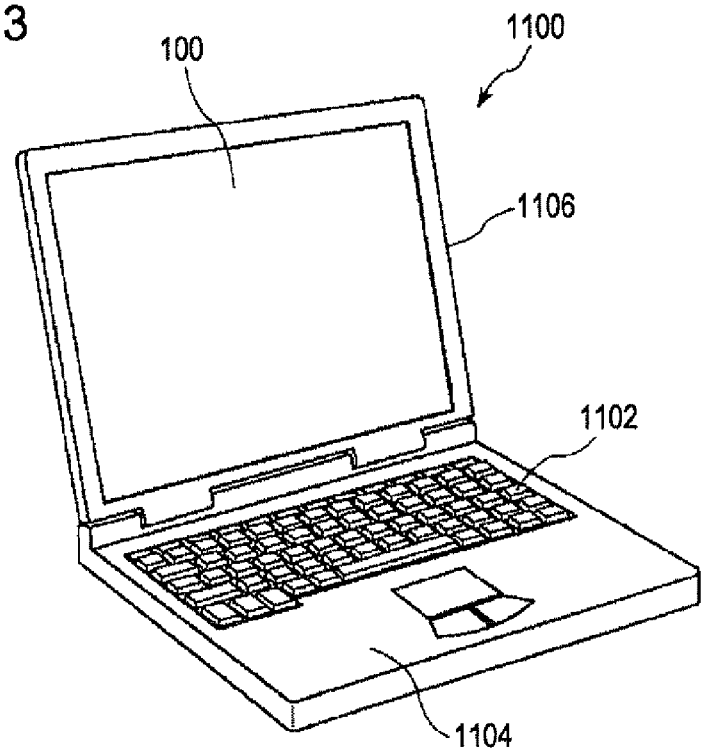
FIG. 3 is a perspective view of a mobile (or notebook) personal computer exemplifying an electronic apparatus according to a preferred embodiment of the present invention.

FIG. 3 is a perspective view of a mobile for notebook) personal computer 1100 exemplifying an electronic apparatus according to an embodiment of the present invention.

With reference to FIG. 3, the mobile personal computer 1100 includes a main body section 1104 including a keyboard 1102 and also includes a display unit 1106 including a display section. The display unit 1106 is rotatably connected to the main body section 1104 with a hinge portion.

In the mobile personal computer 1100, the display section, which is included in the display unit 1106, includes the display 100.

Figure 4:
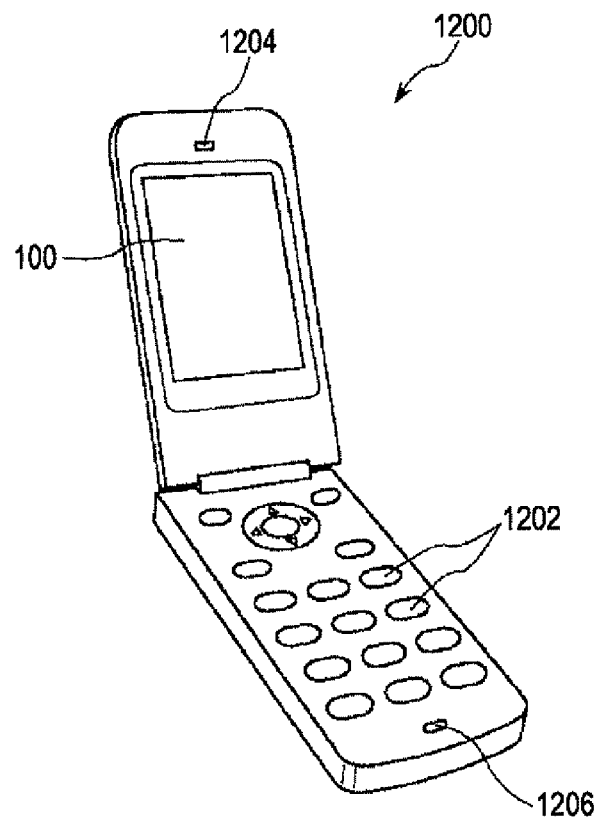
FIG. 4 is a perspective view of a mobile phone (including a personal handyphone system (PHS)) exemplifying the electronic apparatus.

FIG. 4 is a perspective view of a mobile phone 1200 (including a PHS) exemplifying the electronic apparatus.

With reference to FIG. 4, the mobile phone 1200 includes a plurality of operation buttons 1202, an earpiece 1204, a mouthpiece 1206, and a display section.

In the mobile phone 1200, the display section includes the display 100.

Figure 5:
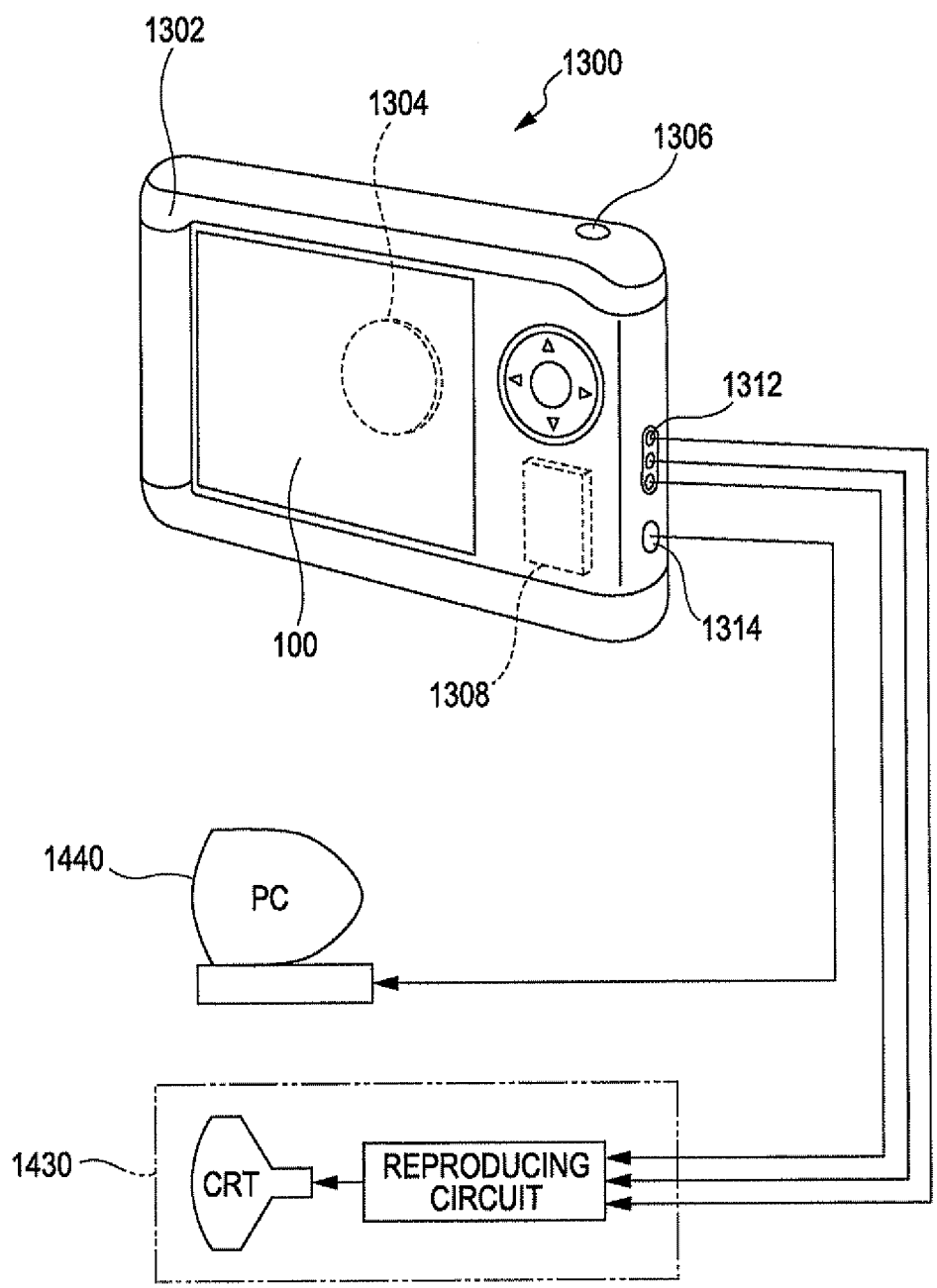
FIG. 5 is a perspective view of a digital still camera exemplifying the electronic apparatus.

FIG. 5 is a perspective view of a digital still camera 1300 exemplifying the electronic apparatus. FIG. 5 also shows external devices connected to the digital still camera 1300.

Ordinary cameras record optical images of subjects by exposing silver-halide films to light. The digital still camera 1300 photoelectrically converts an optical image of a subject into image pickup signals (image signals) using image pickup devices such as charge-coupled devices (CCDs).

The digital still camera 1300 includes a case (body) 1302 and a display section disposed on the back thereof. The display section functions as a finder displaying a subject in the form of an electronic image based on image pickup signals output from CCDs.

In the digital still camera 1300, the display section includes the display 100.

The case 1302 contains a circuit substrate 1308. The circuit substrate 1308 carries a memory capable of storing or memorizing the image pickup signals.

A light-receiving unit 1304 including an optical lens (optical image pickup system) and the CCDs is disposed on the front side of the case 1302 (the back side in FIG. 5).

When a user confirms a subject image displayed on the display section and then presses a shutter button 1306, image pickup signals output from the CCDs at the time are transmitted to and stored in the memory of the circuit substrate 1308.

In the digital still camera 1300, video signal input terminals 1312 and an input/output terminal 1314 for data communication are arranged in a side surface of the case 1302. The video signal input terminals 1312 and the input/output terminal 1314 are connected to a video monitor 1330 and a personal computer 1440, respectively, as required. The image pickup signals stored in the memory of the circuit substrate 1308 are output to the television monitor 1330 or the personal computer 1440 by a predetermined operation.

Examples of the electronic apparatus include televisions; video cameras; viewfinder-type video tape recorders; direct view-type video tape recorders; laptop personal computers; car navigation systems; pagers; electronic notebooks (including those having a communication function); electronic dictionaries; portable electronic calculators; electronic game machines; word processors; work stations; video phones; security video monitors; electronic binoculars; point-of-sale (POS) terminals; electronic apparatuses, such as bank cash dispensers and automated ticket vending machines, having touch panels; medical instruments such as electronic clinical thermometers, sphygmomanometers, blood sugar meters, cardiographic monitors, ultrasonic diagnostic systems, and endoscopic monitors; fish finders; various measuring instruments; instruments such as vehicle instruments, aircraft instruments, and marine instruments; flight simulators; various monitors; and projection displays in addition to the mobile personal computer 1100 shown in FIG. 3, the mobile phone 1200 shown in FIG. 4, and the digital still camera 1300 shown in FIG. 5.

The embodiments of the present invention have been described above with reference to the accompanying drawings. The present invention is not limited to the embodiments.

In one of the embodiments, the light-emitting element 1 includes three light-emitting layers: the red, blue, and green light-emitting layers 61, 62, and 63. The light-emitting element 1 may include four or more light-emitting layers. In this case, when these light-emitting layers commonly contain the first host material, the above advantages can be obtained. The color of light emitted from each light-emitting layer is not limited to red, green, or blue.

EXAMPLE

An example of the present invention is described below in detail.

A light-emitting element was manufactured as described below.

A transparent glass substrate with an average thickness of 0.5 mm was prepared. An ITO electrode serving as an anode was formed on the glass substrate by a sputtering process so as to have an average thickness of 50 nm.

After the glass substrate was immersed in acetone and 2-propanol in that order and was ultrasonically cleaned, the glass substrate was subjected to oxygen plasma treatment.

N,N'-bis(4-diphenylamino-phenyl)-N,N'-diphenyl-biphenyl-4-4'-diamine having Formula (I) was deposited on the ITO electrode by vacuum vapor deposition, whereby a hole injection layer with an average thickness of 40 nm was formed.

N,N'-di(1-naphtyl)-N,N'-diphenyl-1,1'-diphenyl-4,4'-diamine (α-NPD) having Formula (II) was deposited on the hole injection layer by vacuum vapor deposition, whereby a hole transport layer with an average thickness of 20 nm was formed.

A red light-emitting layer (first light-emitting layer) with an average thickness of 10 nm was formed in such a manner that the following materials were deposited on the hole transport layer by vacuum vapor deposition: a red luminescent material (guest material), a first host material, and a second host material. The red luminescent material used was a tetraaryldiindenoperylene derivative having Formula (III). The first host material used was an anthracene compound having Formula (IV). The second host material used was a naphthacene derivative having Formula (V). The content (doping amount) of the red luminescent material (dopant) in the red light-emitting layer was 1.0% by weight. The content of the first host material in the red light-emitting layer was 29% by weight. The content of the second host material in the red light-emitting layer was 70% by weight. The energy gap of the anthracene compound having Formula (IV) was 3.0 eV. The energy gap of the naphthacene derivative having Formula (V) was 2.4 eV. The energy gap of the tetraaryldiindenoperylene derivative having Formula (III) was 2.1 eV.

A blue light-emitting layer (second light-emitting layer) with an average thickness of 30 nm was formed in such a manner that the following materials were deposited on the red light-emitting layer by vacuum vapor deposition: a blue luminescent material and the first host material. The blue luminescent material used was a distyrylamine compound having Formula (VI). The content (doping amount) of the blue luminescent material (dopant) in the blue light-emitting layer was 6.0% by weight.

A green light-emitting layer (third light-emitting layer) with an average thickness of 20 nm was formed in such a manner that the following materials were deposited on the blue light-emitting layer by vacuum vapor deposition: a green luminescent material and the first host material. The green luminescent material used was a quinacridone derivative having Formula (VII). The content (doping amount) of the green luminescent material (dopant) in the green light-emitting layer was 1.0% by weight.

An electron transport layer with an average thickness of 20 nm was formed in such a manner that tris(8-quinolinolato) aluminum (Alq3) having Formula (VIII) was deposited on the green light-emitting layer by vacuum vapor deposition. An electron injection layer with an average thickness of 1 nm was formed in such a manner that lithium fluoride (LiF) was deposited on the electron transport layer by vacuum vapor deposition.

A cathode, made of Al, having an average thickness of 100 nm was formed in such a manner that Al was deposited on the electron injection layer by vacuum vapor deposition.

A protective cover (sealing member) made of glass provided over the layers formed as described above, was fixed, and was then sealed with an epoxy resin.

The light-emitting element 1 was manufactured through the above steps as shown in FIG. 1.

COMPARATIVE EXAMPLE

A light-emitting element was manufactured in substantially the same manner as that described in the above example except that the composition of a red light-emitting layer was different from that described in the example.

A red luminescent material and host material used to form the red light-emitting layer were the tetraaryldiindenoperylene derivative (RD-1) having Formula (III) and the anthracene compound having Formula (IV), respectively. The naphthacene derivative (RB) having Formula (V) was not used to form the red light-emitting layer. The content (doping amount) of the red luminescent material (dopant) in the red light-emitting layer was 1.0% by weight. The content of the first host material in the red light-emitting layer was 99% by weight.

Evaluation

The light-emitting element of the example and the light-emitting element of the comparative example were evaluated for emission efficiency (current efficiency) and driving voltage as described below.

The light-emitting elements were measured for brightness with a luminance meter in such a manner that a constant current of 10 mA/cm$^2$ was applied to each light-emitting element using a direct-current power supply. The current efficiency (cd/A), that is, the brightness per current of the light-emitting element was determined from the brightness thereof. The driving voltage (V) of the light-emitting element was also measured.

Figure 6:
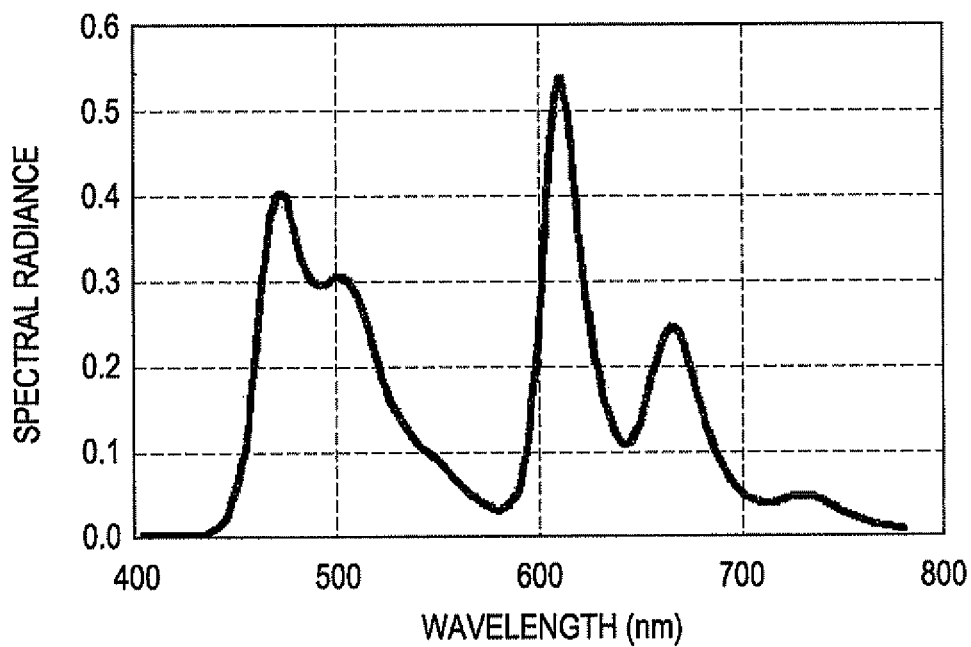
FIG. 6 is a graph showing the emission spectrum of a light-emitting element according to an example of the present invention.
Figure 7:
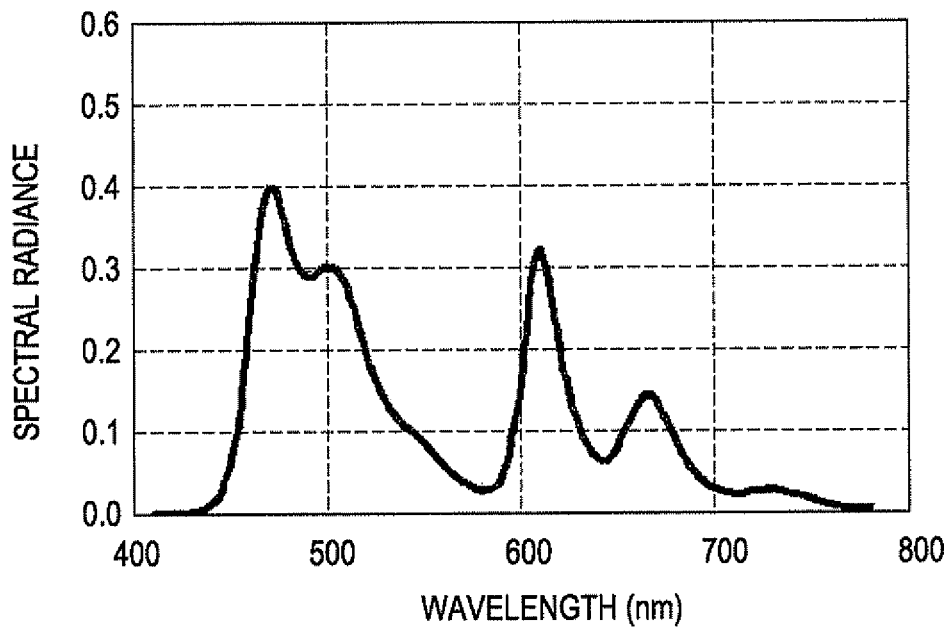
FIG. 7 is a graph showing the emission spectrum of a light-emitting element according to a comparative example.

The spectrum (emission spectrum) and chromaticity (x, y) of light emitted from the light-emitting element were also measured. FIG. 6 shows the emission spectrum of the light-emitting element of the example. FIG. 7 shows the emission spectrum of the light-emitting element of the comparative example. The chromaticity (x, y) of light of a color close to white is close to (0.33, 0.33).

The light-emitting elements were evaluated for emission lifetime as described below.

Each light-emitting element was operated using a direct-current power supply so as to emit light with constant luminance and was measured for initial brightness with a luminance meter. The time (LT80) taken until the brightness of the light-emitting element was reduced to 80% of the initial brightness thereof.

Table 1 summarizes the evaluation results.

TABLE 1

| | Current efficiency (cd/A) | Driving voltage (V) | Chromaticity (x, y) | Emission lifetime (LT80) (h) |
|---|---|---|---|---|
| Light-emitting element of example | 11.8 | 7.0 | (0.36, 0.33) | 307.5 |
| Light-emitting element of comparative example | 9.7 | 6.9 | (0.28, 0.34) | 210.1 |

As is clear from Table 1, the light-emitting element of the example has lower driving voltage, higher current efficiency, and longer emission lifetime as compared to the light-emitting element of the comparative example. Furthermore, the light-emitting element of the example emits light of a color close to white as compared to the light-emitting element of the comparative example.

As is clear from FIGS. 6 and 7, the light-emitting element of the comparative example has lower spectral radiance at long wavelengths as compared to the light-emitting element of the example. This is probably because the red light-emitting layer of the light-emitting element of the comparative example does not contain the naphthacene derivative having Formula (V), which is the second host material, and therefore the red luminescent material does not sufficiently emit light.

The entire disclosure of Japanese Patent Application No. 2009-070434, filed Mar. 23, 2009 is expressly incorporated by reference herein.

What is claimed is:

1. A light-emitting element comprising:
    a cathode;
    an anode; and
    a light-emitting section disposed between the cathode and the anode and which includes a first light-emitting layer, a second light-emitting layer, and a third light-emitting layer, the light-emitting layers each containing: (1) a corresponding one of luminescent materials configured to emit light of different colors, and (2) a plurality of host materials configured to support the luminescent materials, wherein:
    the first, second, and third light-emitting layers commonly include a first host material of the host materials,
    the first light-emitting layer being configured to emit light of a first color having a longer wavelength as compared to light emitted from the second and third light-emitting layers and includes a second host material of the host materials and which is different from the first host material, the second host material being only present in the first light-emitting layer, and
    the second host material being superior in enhancing the luminescence of the first light-emitting layer as compared to the first host material.

2. The light-emitting element according to claim 1, wherein the energy gap of the second host material is less than the energy gap of the first host material and is greater than the energy gap of the luminescent material contained in the first light-emitting layer.

3. The light-emitting element according to claim 1, wherein the content of the second host material in the first light-emitting layer is less than the content of the first host material in the first light-emitting layer.

4. The light-emitting element according to claim 1, wherein the content of the second host material in the first light-emitting layer is 10% to 49% by weight.

5. The light-emitting element according to claim 1, wherein the first host material is an anthracene compound.

6. The light-emitting element according to claim 1, wherein the first color is red.

7. The light-emitting element according to claim 6, wherein the luminescent material contained in the first light-emitting layer is a diindenoperylene derivative.

8. The light-emitting element according to claim 6, wherein the second host material is a naphthacene derivative.

9. The light-emitting element according to claim 1, wherein the first light-emitting layer has a function of capturing electrons and is located closer to the anode than the second and third light-emitting layers.

10. A light-emitting device comprising the light-emitting element according to claim 1.

11. A display comprising the light-emitting device according to claim 10.

12. An electronic apparatus comprising the display according to claim 11.

13. The light-emitting element according to claim 1, wherein the first host material preferably has an energy gap of 2.7 eV to 3.7 eV and more preferably has an energy gap of 3.1 to 3.5 eV.

14. The light-emitting element according to claim 1, wherein the second host material preferably has an energy gap of 2.1 eV to 2.8 eV and more preferably has an energy gap of 2.2 eV to 2.6 eV.

* * * * *